US00RE47608E

(19) United States
(12) Reissued Patent
Koch

(10) Patent Number: US RE47,608 E
(45) Date of Reissued Patent: Sep. 17, 2019

(54) PREDICTIVE TRIGGERING IN AN ELECTRONIC DEVICE

(71) Applicant: SYMBOL TECHNOLOGIES, LLC, Lincolnshire, IL (US)

(72) Inventor: David S. Koch, East Islip, NY (US)

(73) Assignee: Symbol Technologies, LLC, Holtsville, NY (US)

(21) Appl. No.: 15/686,722

(22) Filed: Aug. 25, 2017

Related U.S. Patent Documents

Reissue of:
(64) Patent No.: 9,117,129
Issued: Aug. 25, 2015
Appl. No.: 14/614,485
Filed: Feb. 5, 2015

(51) Int. Cl.

| | |
|---|---|
| ***G06F 3/02*** | (2006.01) |
| ***G06K 7/10*** | (2006.01) |
| ***H01H 3/02*** | (2006.01) |
| ***H01H 9/06*** | (2006.01) |
| ***H03K 17/945*** | (2006.01) |

(52) U.S. Cl.
CPC ..... *G06F 3/0202* (2013.01); *G06K 7/1091* (2013.01); *G06K 7/10118* (2013.01); *H01H 9/06* (2013.01); *H01H 2003/0293* (2013.01); *H03K 17/945* (2013.01)

(58) Field of Classification Search
CPC ..... G06F 3/0202; H01H 9/06; H01H 2003/0293; G06K 7/1091; G06K 7/10118; H03K 17/945; G06Q 10/00; G06Q 20/00; G06Q 20/06; G06Q 20/18; G06Q 20/20; G06Q 20/30065; G06Q 20/123; G06Q 20/367; G06Q 20/382; G06Q 20/383; G06Q 20/385; G06Q 20/409; G06Q 20/3674; G06Q 20/3678; G06Q 30/00; G06Q 30/08; G06Q 30/018; G06Q 30/0185; G06Q 30/0225; G06Q 30/0248; G06Q 30/06; G06Q 30/0609; G06Q 30/0613; G06Q 30/0615; G06Q 30/0617; G06Q 30/0619; G06Q 2220/00; G16H 10/65
See application file for complete search history.

(56) References Cited

U.S. PATENT DOCUMENTS

| | | | | |
|---|---|---|---|---|
| 5,801,371 | A | 9/1998 | Kahn et al. | |
| 6,464,554 | B1 * | 10/2002 | Levy et al. | 446/144 |
| 7,481,372 | B2 | 1/2009 | Wulff et al. | |
| 7,497,382 | B2 | 3/2009 | Mitelman et al. | |
| 7,559,473 | B2 * | 7/2009 | He | 235/462.2 |

(Continued)

FOREIGN PATENT DOCUMENTS

CA 2753501 A1 3/2012

*Primary Examiner* — Jalatee Worjloh

(57) ABSTRACT

A method and apparatus with predictive triggering includes a housing including electronics operable to perform a process that can be activated by a user depressing a trigger with a finger. A trigger is operable to activate the electronics to perform the process. A proximity sensor is operable to detect a user's finger in proximity to the trigger. A processor coupled to the electronics, trigger, and proximity sensor, wherein when the proximity sensor detects a user's finger in proximity to the trigger, before the user's finger actually depresses the trigger, the processor initiates activation of the electronics to perform a portion of the process, and when the user's finger depresses the trigger, the processor directs the electronics to complete the process.

12 Claims, 2 Drawing Sheets

(56) References Cited

U.S. PATENT DOCUMENTS

| | | | | |
|---|---|---|---|---|
| 8,933,905 | B2 * | 1/2015 | Bokma et al. | 345/173 |
| 2002/0110373 | A1 * | 8/2002 | Engle et al. | G03B 17/38 396/263 |
| 2003/0139984 | A1 * | 7/2003 | Seigel | G06F 21/10 705/28 |
| 2003/0169231 | A1 * | 9/2003 | Rekimoto | G06F 3/0362 345/156 |
| 2005/0219228 | A1 | 10/2005 | Alameh et al. | |
| 2005/0258252 | A1 * | 11/2005 | Winter | G06K 7/0004 235/472.02 |
| 2008/0023552 | A1 * | 1/2008 | Gillet et al. | 235/462.36 |
| 2009/0110839 | A1 | 4/2009 | Mather et al. | |
| 2009/0242641 | A1 | 10/2009 | Blasczak | |
| 2010/0079309 | A1 * | 4/2010 | Filson | G06F 3/0219 341/20 |
| 2013/0229335 | A1 * | 9/2013 | Whitman | G06F 1/1618 345/156 |
| 2014/0018128 | A1 | 1/2014 | Martin et al. | |
| 2014/0145953 | A1 | 5/2014 | Tsiopanos et al. | |

* cited by examiner

PREDICTIVE TRIGGERING IN AN ELECTRONIC DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

Triggers or buttons are commonly used on electronic devices. For instance, triggers are employed on mobile computing terminals, bar code scanners, cellular phones, portable digital assistants (PDAs), etc. The trigger is used to initiate certain functions on the device. For instance, the trigger could activate a connection for telephonic communication, activate a data transfer function, or be used to navigate through menu options on a display. In another example, the trigger may activate a data capture engine, such as a module to capture bar code information, wherein the module may include a laser based bar code scanner or an imager for reading a barcode.

Various electro-optical systems have been developed for reading optical indicia, such as barcodes. A barcode is a coded pattern of graphical indicia comprised of a series of bars and spaces of varying widths, the bars and spaces having differing light reflecting characteristics. Systems that read and decode barcodes employing a laser are typically referred to as laser-based barcode readers or barcode scanners. In the case of operating a data capture device such as a bar code scanner, activating a trigger typically would notify a processor to turn on a laser and detector engine, operate a mirror to scan the laser beam over an area, operate the detector engine to receive any light reflections of the laser beam, and decode the reflections to determine if there is any barcode information within the reflections.

Systems that read and decode barcodes employing Charge Coupled Device (CCD) or Complementary Metal Oxide Semiconductor (CMOS)-based imaging systems are typically referred to as imaging-based barcode readers or barcode scanners. Imaging systems include CCD arrays, CMOS arrays, or other imaging pixel arrays having a plurality of photosensitive elements or pixels. In the case of a data capture device such as an imager, activating a trigger typically would notify a processor to turn on an image detector engine, illuminate an area such that light reflected from a target image, e.g., a target barcode, is focused through a lens of the imaging system onto the pixel array. An analog-to-digital converter digitizes output signals from the pixels of the pixel array to capture an image frame of the area. Decoding circuitry of an imaging engine analyzes the digitized signals and attempts to determine if there is any barcode information within the image to decode.

In typical operation, once a decoding sequence has been initiated, an image acquisition process is started, during which an aiming pattern is projected onto the desired barcode during the scanning process. This typically involves an operator engaging a trigger located on the scanner, which enables the aiming pattern to be projected while simultaneously initiating the decoding process of the image or barcode to be scanned. The aiming pattern is then turned off and an illumination is projected through a window of the scanner at a target barcode, of which an image is reflected back through the window at a lens onto an array of photo sensors or pixels located within the CCD or CMOS imager. The pixels of the pixel array are read, generating an analog signal that is sent from the imager engine to an analog to digital converter, which then sends a digital signal to a decoder where it becomes synthesized by the decoder's internal circuitry and analyzed to decode the barcode information. The decode session is terminated with the decoded information being sent to an output port and/or display for the operator's attention. However, in either of an imager or laser-based systems, there is a power expenditure involved in illumination and a certain time latency before decoding can be successful due to the many operating steps.

Accordingly, there is a need for a technique to alleviate the above issues in triggering electronics, power consumption, and operational latency of triggered electronics such as a data capture engine.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
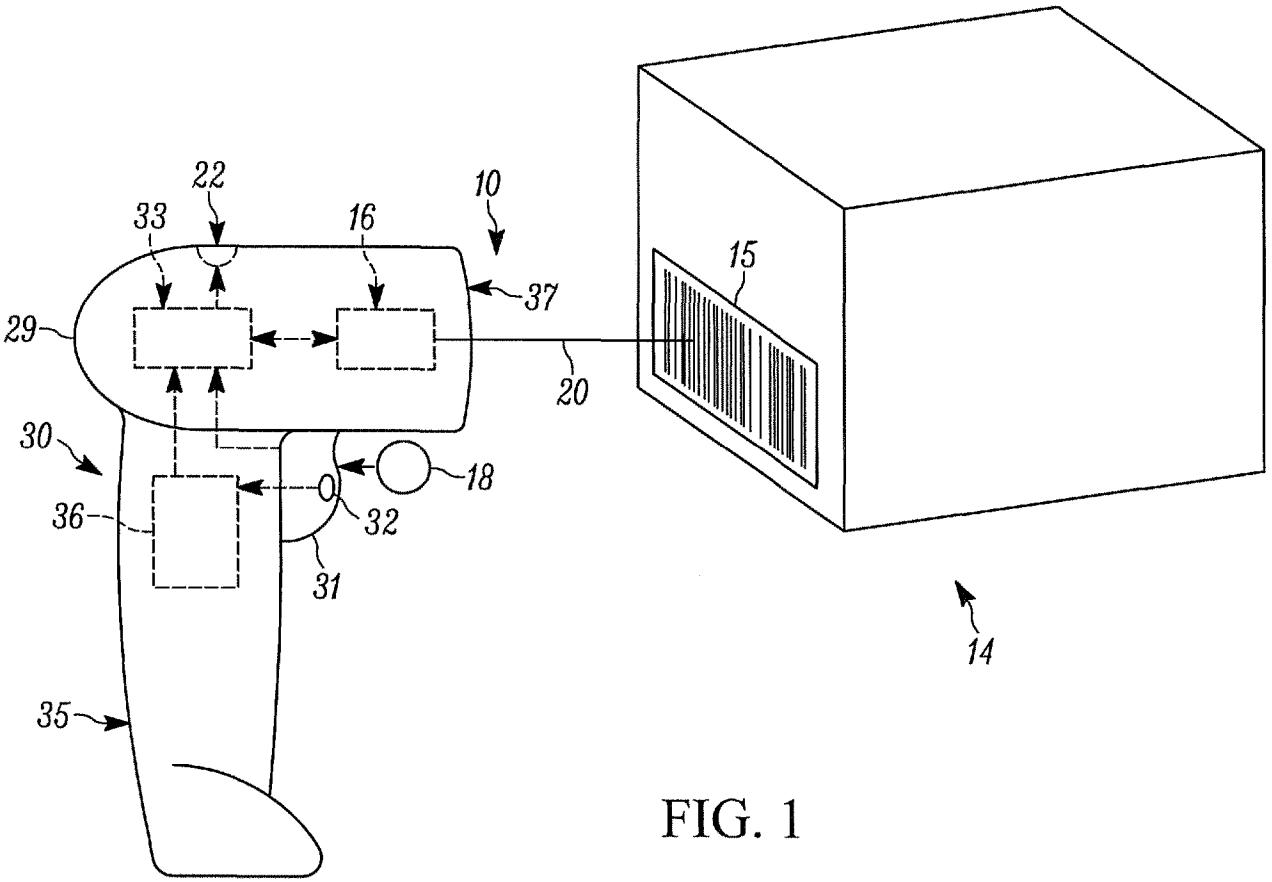
FIG. 1 is a simplified block diagram of an apparatus, in accordance with some embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

A system and method is described that mitigates issues in a trigger assembly and operational latency of triggered electronics. Although the present invention is described in relation to a barcode imager system, it should be recognized that the present invention is also applicable to other systems including laser barcode systems, Radio Frequency (RF) locationing systems, and any electronic system having operational latency issues. For example, Push-To-Talk (PTT) communication systems and digital camera image capture systems could benefit from the present invention.

The present invention is applicable in all electronic devices that have physical buttons to trigger activity like scanning, PTT, camera image capture, and the like. The present invention accelerates decoding performance by performing the image acquisition and decoding process before the trigger is pulled. A sensor can be added near or on the scan trigger button to detect when a user is about to press the scan trigger and start the decode process early. In most cases ambient lighting conditions are good enough that the imager engine can be enabled without it's built-in illumination source to light up an object and without projecting an aiming pattern on an object and still perform a successful decode. In these cases, decode could be performed before the trigger is pressed, and the actual trigger press only serves to immediately create a notification to the user indicating a successful decode occurred. Decode time would appear to a user to be nearly instantaneous, while saving the power that would be used for illumination and/or generation of an aiming pattern.

Various entities are adapted to support the inventive concepts of the embodiments of the present invention. Those skilled in the art will recognize that the drawings do not depict all of the equipment necessary for system to operate but only those system components and logical entities particularly relevant to the description of embodiments herein. For example, routers, controllers, switches, access points, and mobile devices can all includes separate communication interfaces, transceivers, memories, and the like, all under control of a processor. In general, components such as processors, transceivers, memories, and interfaces are well-known. For example, processing units are known to comprise basic components such as, but not limited to, microprocessors, microcontrollers, memory cache, application-specific integrated circuits, and/or logic circuitry. Such components are typically adapted to implement algorithms and/or protocols that have been expressed using high-level design languages or descriptions, expressed using computer instructions, expressed using messaging logic flow diagrams.

Thus, given an algorithm, a logic flow, a messaging/signaling flow, and/or a protocol specification, those skilled in the art are aware of the many design and development techniques available to implement a processor that performs the given logic. Therefore, the entities shown represent a known system that has been adapted, in accordance with the description herein, to implement various embodiments of the present invention. Furthermore, those skilled in the art will recognize that aspects of the present invention may be implemented in and across various physical components and none are necessarily limited to single platform implementations. For example, the memory and control aspects of the present invention may be implemented in any of the devices listed above or distributed across such components.

FIG. 1 shows a typical physical profile of a portable barcode scanner 30 having a triggering assembly according to the present invention. In addition to imaging and decoding 1D and 2D barcodes 24, including postal codes, Uniform Product Code, and Code 39 barcodes, the barcode scanner system 10 is also capable of capturing images and signatures. In one embodiment of the present invention, the barcode scanner 30 is a hand held portable scanner that can be carried and used by a user walking or riding through a store, warehouse or plant, while scanning barcodes for stocking and inventory control purposes, for example. However, it should be recognized that the imaging-based barcode scanner 30 of the present invention, to be explained below, may be advantageously used in connection with any type of imaging-based automatic identification system including, but not limited to, barcode readers, signature imaging acquisition and identification systems, optical character recognition systems, fingerprint identification systems, and the like. It is the intent of the present invention to encompass all such imaging-based automatic identification systems. Moreover, the present invention is also applicable to any electronic system having operational latency issues.

Turning now to FIG. 1, a barcode scanner 30 can include both a handle 35 that is connected to a scanning portion or head 29. Typically located about an upper end of the handle 35 is a trigger 31. In normal operation, when engaged by a user's finger 18 the trigger initiates the reading of a target barcode 15 that comprises lines or different thickness with spaces therebetween. The trigger 31 is coupled to a processor 33 which itself is coupled to the barcode scanner engine 16 and directs the engine for reading of the target barcode 15 positioned on an object 14, as shown.

In normal operation, upon a user's finger 18 depressing the trigger 31, the trigger sends a signal to the processor 33, whereupon the processor activates the barcode scanner engine 16. The barcode scanner engine 16 then activates an aiming pattern 20, which is projected from the scanner 30 through a window 37 using internal mirrors that are also controlled by the scanning engine. The operator aligns the aiming pattern with the target barcode 15, whereupon the scanning engine can analyze reflections from the target barcode 15 and run a decoding sequence to decode the information in the barcode.

In accordance with the present invention, a proximity sensor 32 is located on or near the trigger 31. In other embodiments multiple proximity sensors can be disposed in particular locations on the device to detect different user hand positions. The proximity sensor can be a photo sensor or touch sensor, such as an impedance measuring resistive, capacitive or inductive device that is embedded in the handle 35 or trigger 31 of scanner. The proximity sensor detects when a user's finger 18 approaches the trigger before depressing the trigger. In the case of a photo sensor, an operator placing their finger near the trigger will cause the photo sensor to become covered, thereby changing the light into the photo sensor, which can be detected by a sensor module 36. In the case of an impedance sensor an operator placing their finger near the trigger will cause a change of conductance or capacitance of the sensor, which can be detected by the sensor module 36. The sensor 32 could also be a pressure sensor that activates by pressure induced by the operator finger as he or she touches the trigger. Although the sensor module 36 is shown as a separate entity, it should be recognized that the sensor module could be incorporated into the processor 33. In the example herein, the present invention utilizes a capacitive sensor.

In general, a capacitive sensor 32 in accordance with the present invention can include two coplanar electrodes separated by a narrow gap and connected to a capacitance measuring sensor module 36. An electric field is generated across the gap by the sensor module 36. When an object such as a user's finger is placed near the gap, the capacitance measured between electrodes will change. The sensor may be coated to protect the electrodes from the environment as long as the coating has an appropriate permittivity to permit the resultant electric field to extend through and above the coating such that a user's finger placed above the coating in proximity to the sensor will change the self capacitance across the gap resulting in a disturbance to the electric field that is of a sufficient magnitude to be detected by the sensor module. Alternatively, a capacitance sensor can includes two pairs of parallel electrodes separated by a dielectric gap between electrodes and a narrow gap between pairs. An electric field is generated between the electrode pairs by the sensor module to provide mutual capacitance. As above, the sensor may be coated to protect the electrodes from the environment as long as the coating has an appropriate permittivity to permit the resultant electric field to extend through and above the coating such that a user's finger placed above the coating in proximity to the sensor will change the mutual capacitance between the electrode pairs and across the gap resulting in a disturbance to the electric field that is of a sufficient magnitude to be detected by the sensor module.

If a change in the sensor 32 capacitance measured by the sensor module 36 exceeds a threshold value, this activation information is relayed by the sensor module to the processor 33 as a predictive trigger, whereupon a certain function of the mobile terminal is activated. For instance, if the measured change in capacitance exceeds the threshold value, the mobile terminal can perform one of many different functions, such as scan a bar code with a laser-based scanner, take an image using an imaging module, set up a camera to take a picture, automatic focusing, power electronics on or off, set up to send data over a wireless network, etc. If the measured change in capacitance is less than the threshold value, the predictive triggering functionality of the electronic device will not be activated.

In accordance with the present invention, an apparatus such as an electronic device or data capture device is described. The apparatus can include a housing 30, which comprises a handle 35 and head 29, and that includes the necessary electronics to perform a process that can be activated by a user depressing the trigger with a finger. Accordingly, the apparatus includes a trigger 31 operable to activate the electronics, such as a data capture engine to perform a data capture process.

In accordance with the present invention, the apparatus also includes at least one proximity sensor 32 operable to detect a user's finger in proximity to the trigger 31. A processor 33 is coupled to the electronics, trigger 31, and proximity sensor(s) 32. When the proximity sensor 32 detects a user's finger 18 in proximity to the trigger 31, before the user's finger actually depresses the trigger, the processor 33 initiates activation of the electronics to perform a portion of the process (less than the whole process), and when the user's finger depresses the trigger, the processor directs the electronics to complete the process.

For example, the electronics can include a data capture engine 16 operable to read indicia 15. When the proximity sensor 32 detects a user's finger 18 in proximity to the trigger, before the user's finger actually depresses the trigger, the processor is operable to activate the data capture engine 16 to capture image data, analyze the data, decode any indicia information within the data, and provide any successfully decoded indicia information to the processor 33. It should be noted that this is only a portion of the normal barcode reading process in that the data capture engine does not use any illumination for an imager engine or laser aiming pattern for a laser-based scanner engine. In most cases, ambient lighting conditions are good enough that an imager engine can be enabled and work successfully without using its built-in illumination source to light up a target or without the need to project an aiming pattern. In an alternative embodiment, the data capture engine is a Radio Frequency Identification reader. In any of these cases, an indicia can be decoded before the trigger is actually pressed.

If an indicia is able to be properly decoded without illumination, the actual trigger press would immediately create a notification to the user indicating a successful decode occurred. In this way, decode time would be appear to the user to be nearly instantaneous. If an indicia is not able to be properly decoded without illumination the actual trigger press would initiate a normal decoding process using illumination.

In a further embodiment of the invention, successfully decoding an indicia use predictive triggering includes providing a feedback notification to the user, such as an audio or visual feedback on a user interface. For example, audio feedback could be generated using an existing speaker on the electronic device wherein, after a successful decoding of the indicia, the processor can send an audio signal to the speaker. In a further embodiment, the feedback (e.g. the sound from the speaker or visual feedback) can be different depending on whether predictive triggering or normal triggering is used to decode the indicia. Further, the user can select from a list of sounds and/or visual feedback that he or she would like the terminal to make in response to whether the predictive trigger attempt or normal triggering is used to decode the indicia.

The embodiments described herein are described with respect to a physical trigger button on a handle on a data capture device such as a barcode imager. It should be recognized that the trigger assembly of the present invention could be located on other areas of the data capture device. For instance, the trigger button could be located on the side or face of the data capture device.

Figure 2:
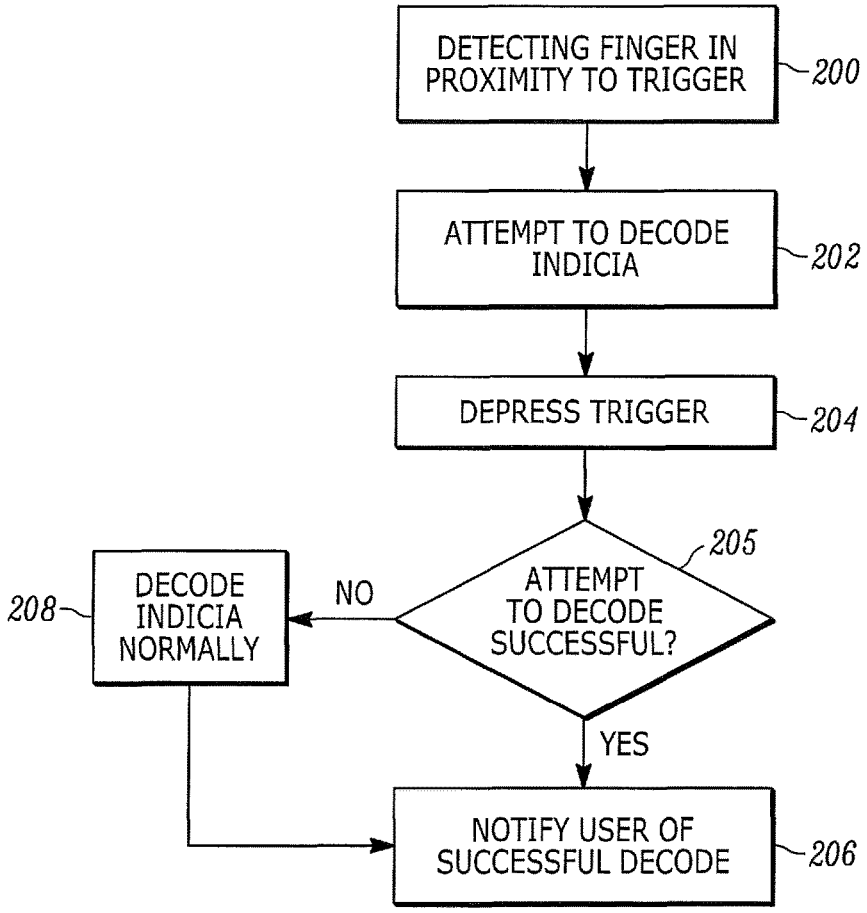
FIG. 2 is a flowchart of a method, in accordance with some embodiments of the present invention.

FIG. 2 illustrates a flowchart of a method for predictive triggering of an electronic device, in accordance with the present invention. The method includes detecting 200 a user's finger in proximity to a trigger of the electronic device. This can include detecting a change in impedance when the user's finger is placed in proximity to the trigger. In particular, this can include detecting a change in capacitance when the user's finger is placed in proximity to the trigger.

A next step includes initiating 202 activation of electronics in the electronic device to perform a portion of a process, e.g. to attempt to decode indicia by a data capture engine. Specifically, the electronics can include a data capture engine, and wherein the process is reading indicia by the data capture engine. The portion of the process can include powering up the data capture engine, automatic focusing, activating the data capture engine to capture data, analyzing the data, decoding any indicia information within the data, and providing any successfully decoded indicia information to the processor. The completion of the process includes providing a notification to the user indicating a successful indicia decoding if a successful indicia decode has occurred 205. However, if the indicia decoding was not successful, pressing of the trigger will trigger a normal decoding process 208, as if the attempt 202 to decode indicia by a data capture engine never happened, without any timing penalty.

A next step includes depressing 204 the trigger of the electronic device.

A next step includes completing 206 the process by providing a feedback notification to the user indicating a successful indicia decoding. The feedback can be different depending on whether predictive triggering or normal triggering is used to decode the indicia.

Advantageously, the present invention can accelerate decode performance by moving the image acquisition and decode process before the trigger is pulled. By adding a capacitive sensor to the scan trigger button, this sensor can know when a user is about to press the scan trigger and start the decode process early. In most cases, ambient lighting conditions are good enough that an imager engine can be enabled and work successfully without using its built-in illumination source to light up a target or without the need to project an aiming pattern. In these cases, a barcode can be decoded before the trigger is pressed, and the actual trigger press would immediately create a notification to the user indicating a successful decode occurred. In this way, decode time would be appear to the user to be nearly instantaneous, while saving the power that would be used for illumination and/or generation of an aiming pattern.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits, in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

[1. A data capture device operable to read indicia with predictive triggering, the apparatus comprising:

a housing including a data capture engine operable to capture data by a user depressing a trigger with a finger;

a trigger operable to activate the data capture engine to perform a data capture process;

a proximity sensor operable to detect a user's finger in proximity to the trigger; and a processor coupled to the data capture engine, trigger, and proximity sensor, wherein when the proximity sensor detects a user's finger in proximity to the trigger, before the user's finger actually depresses the trigger, the processor powers up the data capture engine to perform a portion of the data capture process, and when the user's finger depresses the trigger, the processor directs the data capture engine to complete the data capture process wherein when the proximity sensor detects a user's finger in proximity to the trigger, before the user's finger actually depresses the trigger, the processor is operable to activate the data capture engine without an illumination source to capture data, analyze the data, and decode any indicia information within the data, and provide any successfully decoded indicia information to the processor, and when the user's finger depresses the trigger, if a successful indicia decode has occurred the processor provide a notification to the user indicating the successful indicia decode, and if a successful indicia decode has not occurred activating the data capture engine and the illumination source to capture data.]

[2. The data capture device of claim 1, wherein the proximity sensor is operable to detect a change in impedance when the user's finger is placed in proximity to the trigger.]

[3. The data capture device of claim 1, wherein the proximity sensor is a capacitive sensor operable to detect a change in capacitance when the user's finger is placed in proximity to the trigger.]

[4. The data capture device of claim 1, wherein the data capture engine is one of a laser bar code scanner and an imager.]

[5. The data capture device of claim 1, wherein the data capture engine is a Radio Frequency Identification reader.]

[6. The data capture device of claim 1, wherein when the proximity sensor detects a user's finger in proximity to the trigger, before the user's finger actually depresses the trigger, the processor direct the data capture engine to perform an automatic focusing process.]

[7. An imager operable to read indicia with predictive triggering, the device comprising:

a housing including an imager engine and illumination source operable to capture data when a user depresses a trigger with a finger;

a trigger operable to activate the imager engine to perform a data capture process;

a proximity sensor operable to detect a user's finger in proximity to the trigger; and a processor coupled to the imager engine, illumination source, trigger, and proximity sensor, wherein when the proximity sensor detects a user's finger in proximity to the trigger, before the user's finger actually depresses the trigger, the processor initiates activation of the imager engine but not the illumination source to perform a portion of the data capture process, and when the user's finger depresses the trigger, if the data capture process was successful without using the illumination source, the processor notifies the user that the data capture was already successful, and otherwise the processor directs the imager engine to complete the data capture process using the imager engine and the illumination source.]

8. A method for predictive triggering of a data capture device operable to read indicia, the method comprising:

detecting a user's finger in proximity to a trigger of the data capture engine to perform a data capture process;

whereupon powering up the data capture engine to perform a portion of the data capture process before the user's finger actually depresses the trigger;

*detecting* depressing *of* the trigger of the electronic device; and completing the *data capture* process after *detecting* depressing *of* the trigger, wherein the portion of the *data capture* process includes activating the data capture engine without an illumination source to capture data, analyzing the data, decoding any indicia information within the data, and providing any successfully decoded indicia information to the processor, and wherein *in* the completing step, completion of the *data capture* process includes providing a notification to the user indicating a successful indicia decoding if a successful indicia decode has occurred, and activating the data capture engine and the illumination source to capture data if a successful indicia decode has not occurred.

9. The method of claim 8, wherein detecting *the user's finger* includes detecting a change in impedance when the user's finger is placed in proximity to the trigger.

10. The method of claim 8, wherein detecting *the user's finger* includes detecting a change in capacitance when the user's finger is placed in proximity to the trigger.

11. The method of claim 8, wherein the portion of the *data capture* process further includes performing an automatic focusing process.

12. The method of claim 8, wherein the completing step includes providing a feedback notification to the user, wherein the feedback can be different depending on whether predictive triggering or normal triggering is used to decode the indicia.

*13. The method of claim 8, wherein the data capture device is one of a laser bar code scanner and an imager.*

*14. A computer readable medium having stored thereon computer executable instructions for predictive triggering of a data capture device operable to read indicia, the instructions comprising:*

*detecting a user's finger in proximity to a trigger of the data capture engine to perform a data capture process;*

*whereupon powering up the data capture engine to perform a portion of the data capture process before the user's finger actually depresses the trigger;*

*detecting depressing of the trigger of the electronic device; and*

*completing the data capture process after detecting depressing of the trigger,*

*wherein the portion of the data capture process includes activating the data capture engine without an illumination source to capture data, analyzing the data, decoding any indicia information within the data, and providing any successfully decoded indicia information to the processor, and wherein completing the data capture process further includes providing a notification to the user indicating a successful indicia decoding if a successful indicia decode has occurred, and activating the data capture engine and the illumination source to capture data if a successful indicia decode has not occurred.*

*15. The computer readable medium of claim 14, wherein detecting the user's finger includes detecting a change in impedance when the user's finger is placed in proximity to the trigger.*

*16. The computer readable medium of claim 14, wherein detecting the user's finger includes detecting a change in capacitance when the user's finger is placed in proximity to the trigger.*

*17. The computer readable medium of claim 14, wherein the portion of the data capture process further includes performing an automatic focusing process.*

*18. The computer readable medium of claim 14, wherein the completing instructions further include providing a feedback notification to the user, wherein the feedback can be different depending on whether predictive triggering or normal triggering is used to decode the indicia.*

*19. The computer readable medium of claim 14, wherein the data capture device is one of a laser bar code scanner and an imager.*

* * * * *